(12) United States Patent
Doraisamy et al.

(10) Patent No.: US 10,787,361 B2
(45) Date of Patent: Sep. 29, 2020

(54) SENSOR DEVICE WITH FLIP-CHIP DIE AND INTERPOSER

(71) Applicant: NXP USA, INC., Austin, TX (US)

(72) Inventors: Stanley Job Doraisamy, Seremban (MY); Meng Kong Lye, Shah Alam (MY); Norazham Mohd Sukemi, Subang Jaya (MY)

(73) Assignee: NXP USA, Inc., Austin, TX (US)

( * ) Notice: Subject to any disclaimer, the term of this patent is extended or adjusted under 35 U.S.C. 154(b) by 67 days.

(21) Appl. No.: 16/174,296

(22) Filed: Oct. 30, 2018

(65) Prior Publication Data
US 2020/0131026 A1  Apr. 30, 2020

(51) Int. Cl.
| | |
|---|---|
| *H01L 29/84* | (2006.01) |
| *B81B 7/00* | (2006.01) |
| *B81C 1/00* | (2006.01) |
| *G01L 9/00* | (2006.01) |
| *B60C 23/02* | (2006.01) |

(52) U.S. Cl.
CPC ............ *B81B 7/007* (2013.01); *B81B 7/0061* (2013.01); *B81C 1/00301* (2013.01); *B81C 1/00309* (2013.01); *G01L 9/0042* (2013.01); *B60C 23/02* (2013.01); *B81B 2201/0235* (2013.01); *B81B 2201/0264* (2013.01); *B81B 2207/012* (2013.01); *B81B 2207/098* (2013.01); *B81C 2203/0154* (2013.01); *B81C 2203/0792* (2013.01)

(58) Field of Classification Search
CPC ...... B81B 7/0058; B81B 7/007; B81B 7/0061
See application file for complete search history.

(56) References Cited

U.S. PATENT DOCUMENTS

| | | |
|---|---|---|
| 6,661,084 B1 | 12/2003 | Peterson et al. |
| 8,946,833 B2 | 2/2015 | Higgins, III |
| 9,040,352 B2 | 5/2015 | Kuo et al. |
| 9,362,479 B2 | 6/2016 | Lo et al. |
| 2007/0023873 A1 | 2/2007 | Park et al. |
| 2014/0116122 A1 | 5/2014 | Lammel et al. |
| 2015/0054099 A1 | 2/2015 | Yow et al. |
| 2015/0069537 A1* | 3/2015 | Lo ............................ H01L 24/97 257/415 |
| 2016/0084722 A1 | 3/2016 | Hooper et al. |
| 2017/0243858 A1* | 8/2017 | Chou ................... H01L 25/0657 |
| 2017/0247250 A1* | 8/2017 | Otte ....................... B81B 7/0058 |
| 2018/0016133 A1* | 1/2018 | Cadag ................... H01L 21/565 |

* cited by examiner

*Primary Examiner* — Phuc T Dang
(74) *Attorney, Agent, or Firm* — Charlene R. Jacobsen

(57) ABSTRACT

A semiconductor sensor device includes a lead frame flag having a vent hole, an interposer mounted on the flag and having a vent hole in fluid communication with the vent hole of the flag, and a sensor die having an active region. The sensor die is mounted on and electrically connected to the interposer in a flip-chip manner such that the vent hole of the interposer is in fluid communication with the active region of the sensor die. Bond wires electrically connect the interposer to one or more other components of the device. A molding compound covers the sensor die, the interposer, and the bond wires. The sensor die may be a pressure-sensing (P-cell) die, and the device may also include a microcontroller unit (MCU) die and an acceleration-sensing (G-cell) die, for tire pressure monitoring applications.

14 Claims, 8 Drawing Sheets

SECTION X-X

100

SECTION X-X

SECTION X-X

SECTION Y-Y

400

400

SECTION Y-Y

500

600

700

800

900

1000

1100

1100

SECTION P-P

SENSOR DEVICE WITH FLIP-CHIP DIE AND INTERPOSER

BACKGROUND

The present invention relates generally to semiconductor sensor devices and, more particularly, to semiconductor sensor devices for tire-pressure monitoring systems (TPMS).

Semiconductor sensor devices, such as packaged TPMS pressure sensors, are well known. Each such device contains a pressure-sensing semiconductor die (aka P-cell), such as a piezo-resistive transducer or a parameterized layout cell, having an active, pressure-sensitive region on the top surface of the die. Such a P-cell does not allow full encapsulation in conventional molding compound, because that would prevent ambient atmospheric pressure from reaching the active region, thereby impeding the P-cell's functionality.

FIG. 1 is a cross-sectional side view of a conventional semiconductor sensor device 100 having a pressure-sensing die (P-cell) 102 with an active surface 103, an acceleration-sensing die (G-cell) 104, and a micro controller unit (MCU) die 106 that processes pressure and acceleration signals generated by the P-cell 102 and G-cell 104, respectively. The device 100 is assembled using a metal (e.g., copper) lead frame 110, which includes a flag 112 and a plurality of leads 114. The G-cell 104 and the MCU 106 are mounted on the flag 112 (aka die paddle or die pad) using die attach film 120. The P-cell 102 is mounted or stacked on the MCU 106 using die attach adhesive 122. The P-cell 102 and the G-cell 104 are electrically connected to the MCU 106 and the MCU 106 is electrically connected to one or more of the leads 114 with respective bond wires 124.

The G-cell 104, the bond wires 124 connecting the MCU 106 to the G-cell 104 and to the leads 114, and portions of the MCU 106 are encapsulated within a relatively rigid molding compound 126 that is applied using a film-assist molding (FAM) process, while the P-cell 102, the rest of the bond wires 124, and the remaining portions of the MCU 106 are covered by a relatively flexible pressure-sensitive gel 128.

A lid 130, which has a vent hole 132, is mounted on the molding compound 126 using lid adhesive 134. The vent hole 132 allows the ambient atmospheric pressure outside the sensor device 100 to reach the gel-covered P-cell 102. The molding compound 126, the gel 128, and the lid 130 protect the dies and the wire bonds from mechanical damage during packaging and environmental damage (e.g., contamination and/or corrosion) when in use. The gel 128 protects the bond wires 124 that connect the P-cell 102 to the MCU 106, while enabling the pressure-sensitive active region 103 on the top surface of the P-cell 102 to detect the ambient atmospheric pressure.

One problem with the design of the sensor device 100 is the high manufacturing costs associated with the FAM process used to apply the molding compound 126, the gel-coating process used to apply the gel 128, and the lid-attach process used to attach the lid 130. Accordingly, it would be advantageous to have a more economical way to assemble semiconductor sensor devices.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Figure 1:
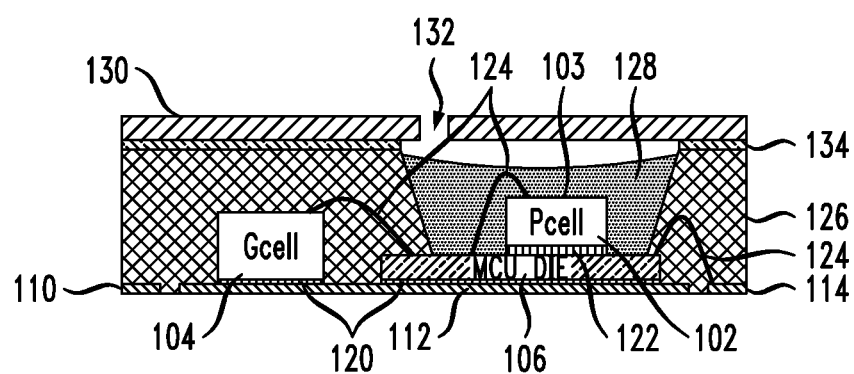
FIG. 1 is a cross-sectional side view of a conventional packaged semiconductor sensor device.

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a", "an", and "the", are intended to include the plural forms as well, unless the context clearly indicates otherwise. It further will be understood that the terms "comprises", "comprising", "has", "having", "includes", or "including" specify the presence of stated features, steps, or components, but do not preclude the presence or addition of one or more other features, steps, or components. It also should be noted that, in some alternative implementations, the functions/acts noted might occur out of the order noted in the figures. For example, two figures shown in succession may in fact be executed substantially concurrently or may sometimes be executed in the reverse order, depending upon the functionality/acts involved. The term "or" is to be interpreted as inclusive unless indicated otherwise.

According to embodiments of the present invention, semiconductor sensor devices, such as packaged TPMS devices, can be assembled without having to perform film-assisted molding (FAM), gel-coating, and lid-attach processes.

In one embodiment, the present invention is a semiconductor sensor device assembled using a lead frame that has a flag and a plurality of leads that surround the flag, and where the flag has a vent hole. An interposer is mounted on the lead frame flag and has a vent hole in fluid communication with the vent hole of the lead frame flag. A sensor die having an active region is mounted on and electrically connected to the interposer in a flip-chip manner such that the vent hole of the interposer is in fluid communication with the active region of the sensor die. Bond wires electrically connect the interposer to one or more other components of the device. A molding compound covers the sensor die, the interposer, and the bond wires.

In another embodiment, the present invention is a method for assembling a semiconductor sensor device. The method includes mounting an interposer having a vent hole on a lead frame flag having a vent hole such that the interposer vent hole is in fluid communication with the flag vent hole, and mounting on the interposer, in a flip-chip manner, a sensor die having an active region, such that the vent hole of the interposer is in fluid communication with the active region of the sensor die. Wire bonding is performed to electrically connect one or more other components of the device to the interpose using bond wires. A molding compound is used to encapsulate the sensor die, the interposer, and the bond wires.

Figure 2A:
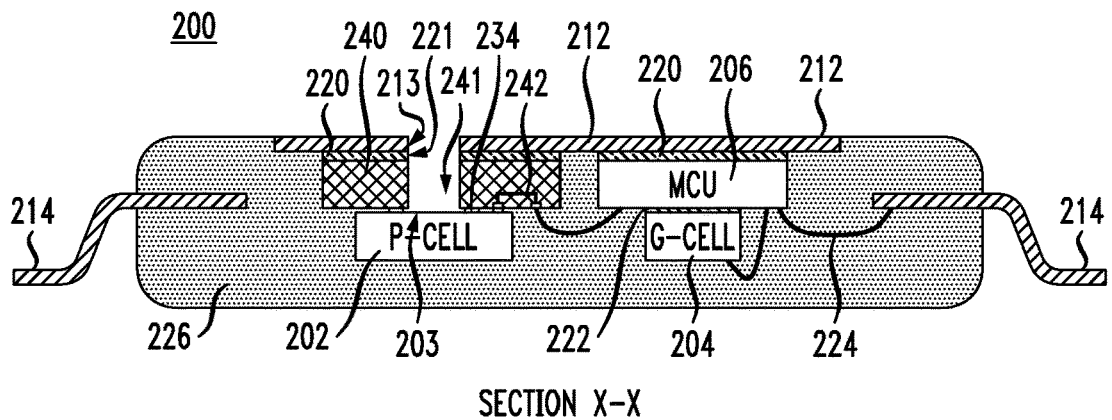
FIG. 2A is a cross-sectional side view (along the cut line X-X of FIG. 2B) of a packaged semiconductor sensor device in accordance with an embodiment of the present invention.
Figure 2B:
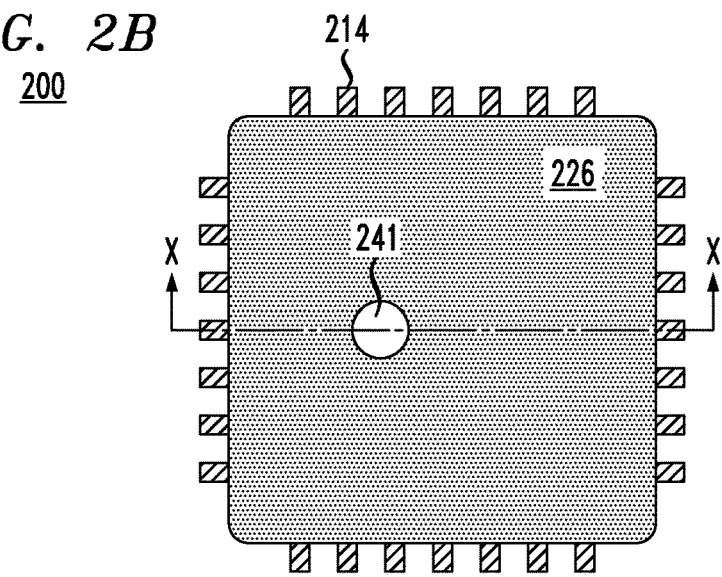
FIG. 2B is a top plan view of the sensor device of FIG. 2A.
Figure 2C:
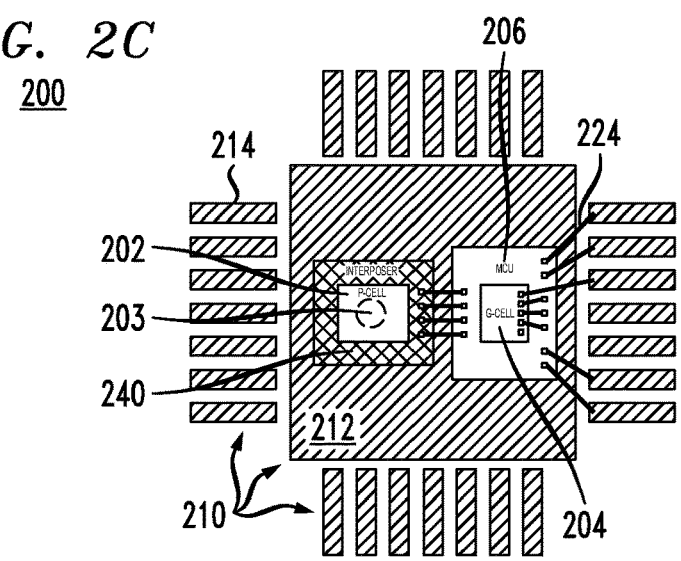
FIG. 2C is a bottom view of the sensor device of FIG. 2A before molding.

Referring now to FIGS. 2A-2C, FIG. 2A is a cross-sectional side view (along the cut line X-X of FIG. 2B) of a packaged semiconductor sensor device 200 in accordance with an embodiment of the invention, FIG. 2B is a top view of the sensor device 200, and FIG. 2C is a bottom view of the sensor device 200 before molding. As explained in further detail below, the sensor device 200 is assembled "upside down" and then turned over to the orientation shown in FIG. 2A. With that understanding, the configuration of the sensor device 200 is explained as follows.

The sensor device 200 includes a P-Cell 202 having an active surface 203, a G-Cell 204, and a MCU 206, and is assembled using a lead frame 210 having a flag 212 having a hole 213 and a plurality of leads 214 that surround the flag 212. The lead frame 210 may be formed of copper, an alloy of copper, a copper-plated iron/nickel alloy, plated aluminum, or the like. Often, copper lead frames are pre-plated first with a nickel base layer, then a palladium mid-layer, and finally with a very thin, gold upper layer.

The MCU 206 is mounted on the flag 212 with a DAF tape 220 or other suitable means for mounting a die to a substrate. An interposer 240 having a hole 241 also is mounted on the flag 212 with the DAF tape 220, but this portion of the DAF tape 220 includes a hole 221. The hole 221 is in fluid communication with the hole 213 in the flag 212 and the hole 241 in the interposer 240. Further, the holes 213, 221 and 241 are aligned over the active region 203 of the P-Cell 202, which allows the P-cell to sense the ambient pressure.

The G-cell 204 is mounted on the MCU 206 using a suitable die-attach adhesive 222 (or other suitable means for mounting one die on another die), and the P-cell 202 is mounted on and electrically connected to the interposer 240 in a flip-chip manner using a suitable conductive die-attach epoxy 234 (or other suitable means for mounting and electrically connecting one die onto another die).

Flip-chip bonding is a process known in the art for physically and electrically coupling die pads on a die, such as the P-cell 202, to the exposed ends of metal vias in a substrate, such as the interposer 240, where each of the die pads is substantially aligned with a corresponding metal via. In a typical BGA (ball grid array) flip-chip process, controlled collapse chip connection (C4) metal bumps are first deposited by plating, jetting, stud bumping, direct placement (e.g., ball drop), or screen printing the bumps onto either the die pads or the metal vias. Then the die and the substrate are brought into close contact, and the metal bumps are bonded to both the die pads and the metal vias using heat, pressure, and ultrasonic vibration in a thermosonic process or heat and pressure in a reflow process.

As known in the art, an interposer is an integrated electrical interface designed to spread a connection to a wider pitch or reroute a connection to a different connection. In the sensor device 200, the interposer 240 provides one or more conductive interconnects 242 for electrically connecting the P-cell 202 to the MCU 206 with corresponding bond wires 224. In addition, the MCU 206 is electrically connected both to the G-cell 204 and to one or more leads 214 of the lead frame 210 with respective ones of the bond wires 224. The bond wires 224 are formed from a conductive material such as aluminum, silver, gold, or copper, and may be either coated or uncoated. All of these components of the sensor device 200 are encapsulated by a suitable molding compound 226. The molding compound 226 may be a plastic, an epoxy, a silica-filled resin, a ceramic, a halide-free material, the like, or a combination thereof, as known in the art.

The MCU 206 functions as the controller for the sensor device 200 by, for example, controlling the operations of and processing of signals generated by the G-cell 204 and the P-cell 202. The P-cell 202, the G-cell 204, and the MCU 206 are well-known components used in semiconductor sensor devices and thus detailed descriptions thereof are not necessary for a complete understanding of the invention.

As represented in FIGS. 2A-2C, the lead frame flag 212, the DAF tape 220, and the interposer 240 have corresponding vent holes 213, 221, and 241 that expose the (e.g., centrally located) pressure-sensitive active region 203 of the P-cell 202 to ambient atmospheric pressure outside the sensor device 200. Note that, in FIG. 2C, the active region 203 is indicated by a broken circle because the active region 203 is on the other side of the P-cell 202 in that view.

As represented in FIG. 2A, the lead frame flag 212 functions as the lid for the sensor device 200. As such, there is no need to mount a separate lid analogous to the lid 130 of the sensor device 100 of FIG. 1.

Furthermore, as explained below, since the molding compound 226 is applied over all the exposed components, there is no need to employ an expensive film-assist molding (FAM) process when applying the molding compound 226.

Lastly, unlike the sensor device 100 of FIG. 1, since all the bond wires 224 are encapsulated in the molding compound 226, an expensive pressure-sensitive gel analogous to the pressure-sensitive gel 128 of FIG. 1 is not needed to protect any bond wires. Note that the option still exists to apply a pressure-sensitive gel over the exposed active surface 203 of the P-cell 202, for example, to protect the P-cell 202 from environmental damage.

FIGS. 3A through 11B illustrate one possible process for assembling the sensor device 200 of FIGS. 2A-2C. Those skilled in the art will understand that other suitable manufacturing steps are possible.

Figure 3A:
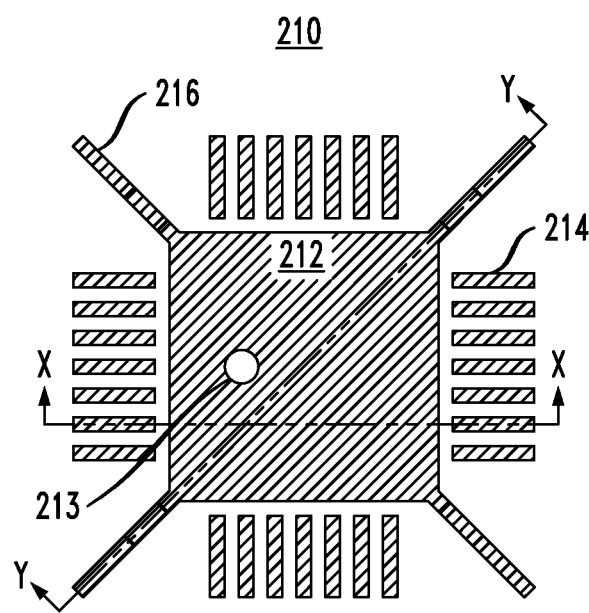
FIG. 3A is a plan view of a lead frame of the sensor device of FIG. 2A, and FIGS. 3B and 3C are sectional views of the lead frame of FIG. 3A along lines X-X and Y-Y, respectively.
Figure 3B:
Figure 3C:
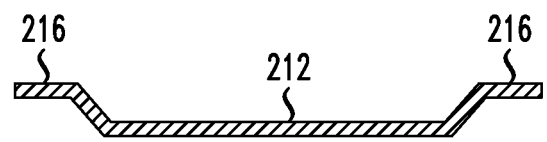

FIG. 3A is a plan view of the lead frame 210 of FIGS. 2A-2C having the flag 212 with the vent hole 213 and surrounded on all four sides by leads 214 and supported by tie bars 216. Although the embodiment has leads 214 on all four sides of the flag 212, this is not a requirement, as one or more sides could have no, fewer or even more leads on that side. FIGS. 3B and 3C are cross-sectional side views of the lead frame 210 of FIG. 3A along the cut lines X-X and Y-Y, respectively. FIGS. 3B and 3C illustrate the down-set of the flag 212 relative to the leads 214 and the tie bars 216. Note that, for purposes of simplification, the tie bars 216 are not represented in any of the other figures.

In a preferred assembly process, the lead frame 210 of FIGS. 3A-3C is one of many similar lead frames in a two-dimensional lead frame array, such that multiple instances of the sensor device 200 are made in parallel. For purposes of simplification, the other lead frames in the array are not shown in any of the figures.

Figure 4A:
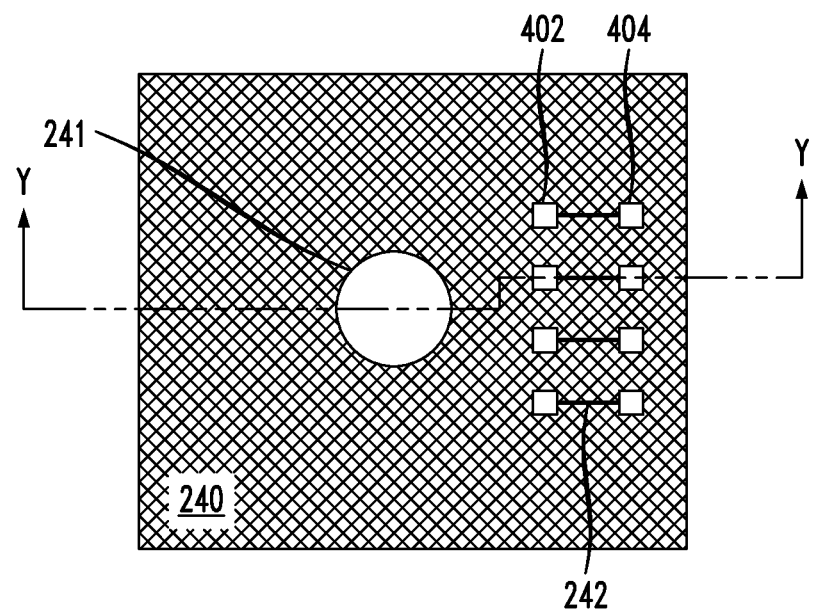
FIG. 4A is a plan view of a sub-assembly that includes an interposer and DAF tape of the device of FIG. 2A.
Figure 4B:
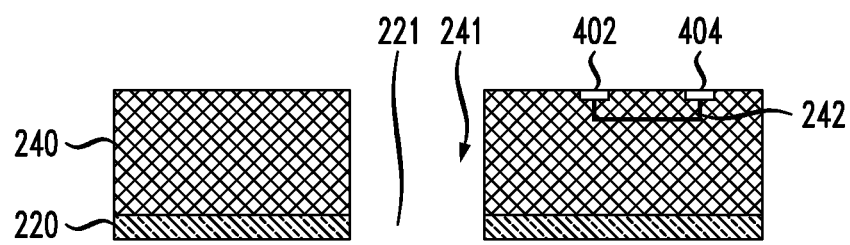
FIG. 4B is a cross-sectional side view along line Y-Y of FIG. 4A of the subassembly of FIG. 4A.

FIG. 4A is a plan view of a sub-assembly 400 that includes the interposer 240 having the vent hole 241. FIG. 4B is a cross-sectional side view (along cut line Y-Y of FIG. 4A) of the sub-assembly 400 showing the DAF tape 220 having the vent hole 221. Internal interconnects 242 within the interposer 240 have inner pads 402 and outer pads 404 on the top surface of the interposer 240, where, the inner pads 402 are electrically mated with corresponding pads (not labeled) on the P-cell 202 and the outer pads 404 are electrically mated to corresponding bond wires 224.

Figure 5:
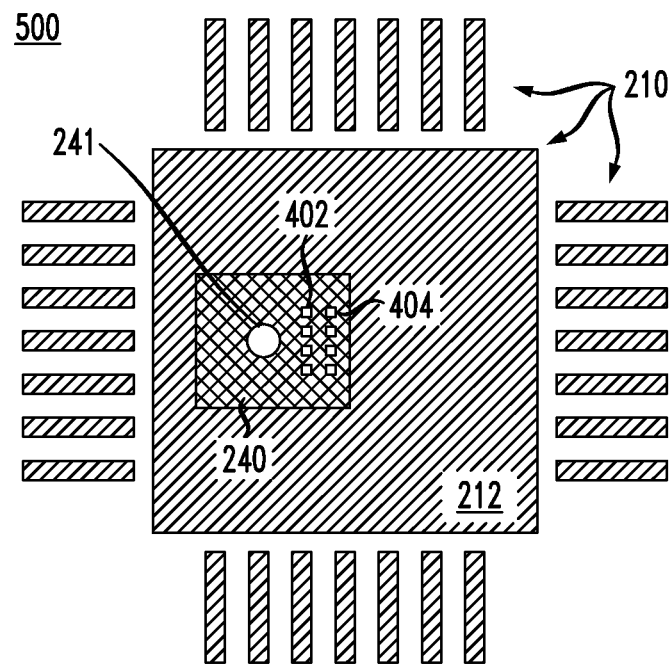
FIG. 5 is a plan view of a sub-assembly that is produced by mounting the sub-assembly of FIG. 4B on a lead frame flag of FIG. 3A.

FIG. 5 is a plan view of a sub-assembly 500 that is produced by mounting the sub-assembly 400 of FIG. 4B on the lead frame flag 212 of FIGS. 3A-3C with the vent holes 213, 221, and 241 co-aligned to provide fluid communication between them.

Figure 6:
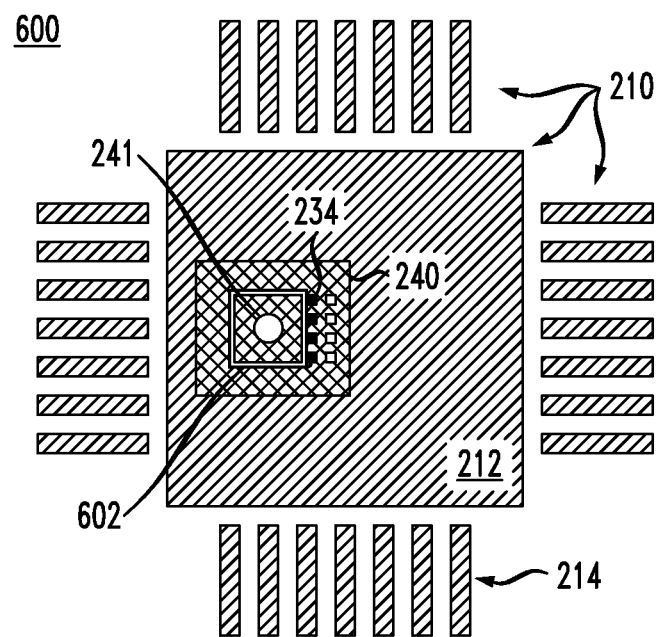
FIG. 6 is a plan view of a sub-assembly that is produced by applying a conductive die-attach epoxy of the device of FIG. 2A on an interposer of the sub-assembly of FIG. 5.

FIG. 6 is a plan view of a sub-assembly 600 that is produced by applying the conductive die-attach epoxy 234 on the interposer 240 of the sub-assembly 500 of FIG. 5 using a suitable stamping and printing process. Note that, in addition to being applied in a ring 602 around the interposer vent hole 241, the die-attach epoxy 234 also is applied to each of the inner pads 402 of the interposer 240, where the epoxy 234 on each inner pad 402 is electrically isolated from the epoxy 234 on each other inner pad 402 as well as from the ring 602 of epoxy 234 around the vent hole 241.

Figure 7:
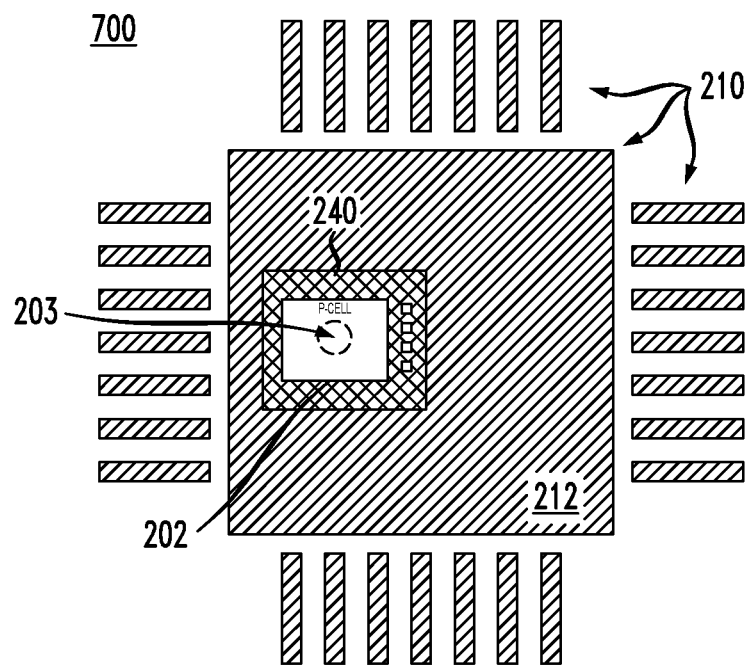
FIG. 7 is a plan view of a sub-assembly that is produced by mounting a P-cell of the device of FIG. 2A in a flip-chip manner on the interposer of the sub-assembly of FIG. 6.

FIG. 7 is a plan view of a sub-assembly 700 that is produced by mounting the P-cell 202 in a flip-chip manner onto the interposer 240 of the sub-assembly 600 of FIG. 6, with the pressure-sensitive active region 203 of the P-cell 202 co-aligned with the vent holes 213, 221, and 241 to provide fluid communication between them to enable the P-cell 202 to sense ambient atmospheric pressure outside of the sensor device 200.

Figure 8:
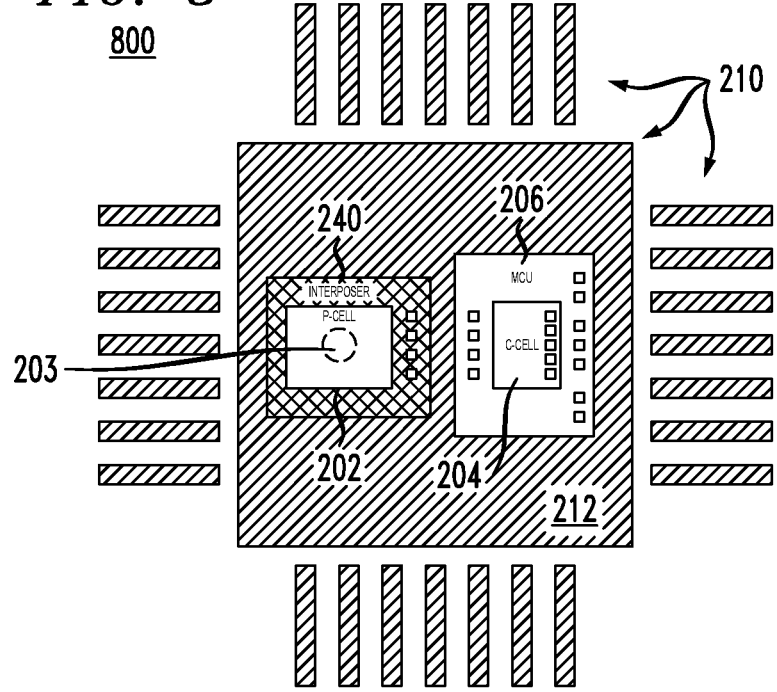
FIG. 8 is a plan view of a sub-assembly that is produced by (i) mounting an MCU of the device of FIG. 2A on a lead frame flag of the sub-assembly of FIG. 7 and (ii) mounting a G-cell of the device of FIG. 2A on the MCU of the device of FIG. 2A.

FIG. 8 is a plan view of a sub-assembly 800 that is produced by (i) mounting the MCU 206 on the lead frame flag 212 of the sub-assembly 700 of FIG. 7 and (ii) mounting the G-cell 204 on the MCU 206. Note that, depending on the particular implementation, the G-cell 204 can be mounted on the MCU 206 either before or after the MCU 206 is mounted on the flag 212.

Note further that the steps represented by FIGS. 5-8 can be implemented in a different order. For example, the MCU 206 and the G-cell 204 can be mounted before the interposer 240 and the P-cell 202 are mounted. Other sequences also are possible.

Figure 9:
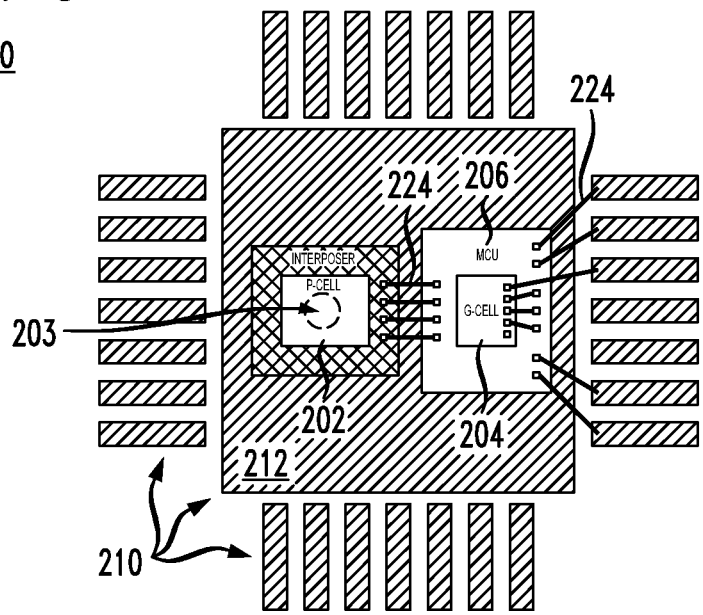
FIG. 9 is a plan view of a sub-assembly that is produced after performing wire bonding on the sub-assembly of FIG. 8.

FIG. 9 is a plan view of a sub-assembly 900 that is produced by wire bonding the subassembly 800 of FIG. 8. In particular, (i) the MCU 206 is electrically connected to the G-cell 204, the P-cell 202, and the corresponding lead frame leads 214 with bond wires 224 and (ii) the G-cell 204 is electrically connected to the MCU 206 with the corresponding bond wires 224.

Figure 10:
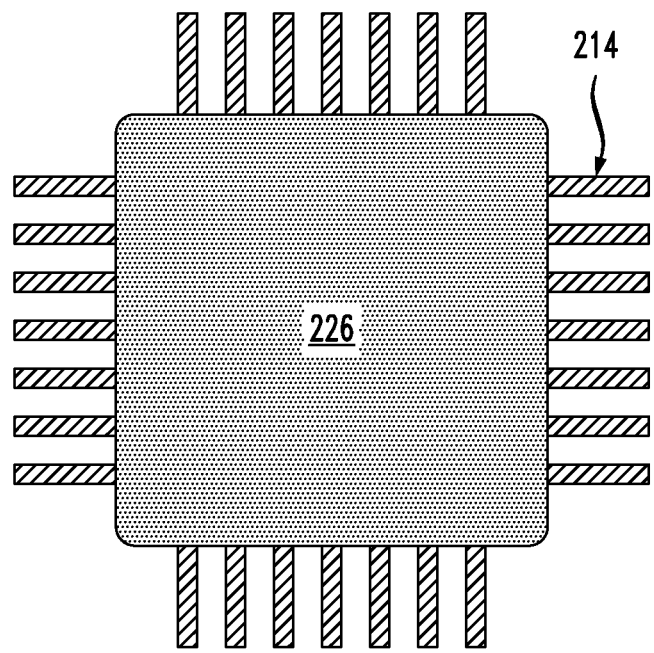
FIG. 10 is a plan view of a sub-assembly that is produced by applying a molding compound on the sub-assembly of FIG. 9.

FIG. 10 is a plan view of a sub-assembly 1000 produced by applying the molding compound 226 on the sub-assembly 900 of FIG. 9. Note that the molding compound 226 is applied over all the exposed components on the top side of the sub-assembly 900. As such, an expensive film-assist molding (FAM) process does not need to be performed.

Figure 11A:
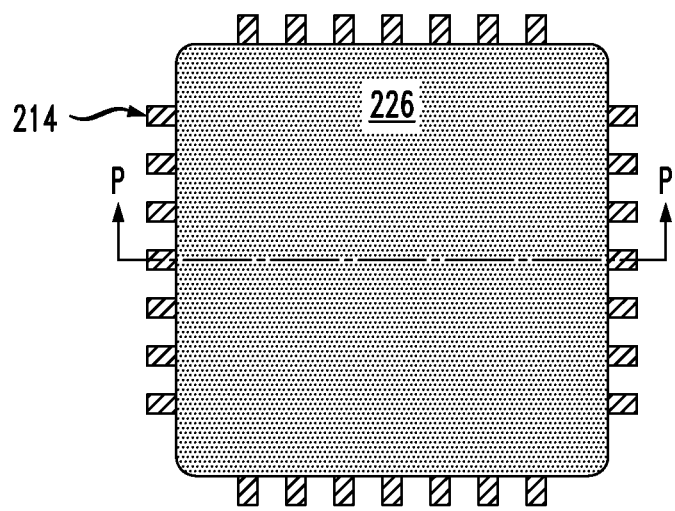
FIG. 11A is a plan view of an assembly that is produced performing singulation and trim and form processes on the sub-assembly of FIG. 10.
Figure 11B:
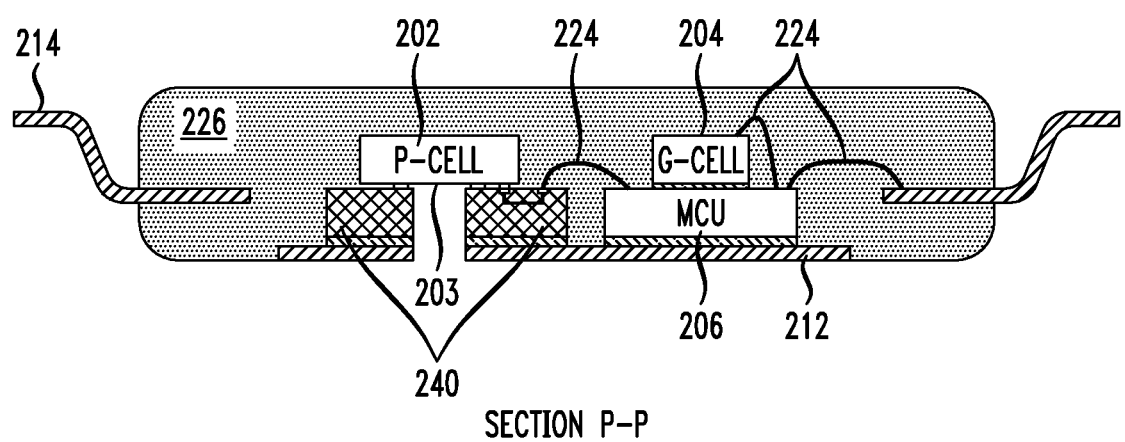
FIG. 11B is a cross-sectional side view of the assembly of FIG. 11A along cut line P-P.

FIG. 11A is a plan view of an assembly 1100 and FIG. 11B is a cross-sectional side view of the assembly 1100 along the cut line P-P that is produced by (i) performing singulation using a stamp, saw, laser or combination thereof on the two-dimensional array of multiple instances of the sub-assembly 1000 of FIG. 10 and (ii) performing a trim and form process including bending the leads 214 into reverse gull-wing shapes, as shown in FIG. 11B. Note that the assembly 1100 is equivalent to the sensor device 200 of FIG. 2A in an upside-down orientation.

As represented in FIG. 2A and unlike in the prior-art sensor device 100 of FIG. 1, all the bond wires 224 are encapsulated within the molding compound 226. As such, as represented in FIG. 2A, the sensor device 200 is shown without any pressure-sensitive gel similar to the gel 128 of FIG. 1. If appropriate, however, after turning over the sub-assembly 1100 of FIG. 11B, a pressure-sensitive gel can be applied through the vent holes 213, 221, and 241 onto the exposed surface of the P-cell 202 of FIG. 2A. The gel material may be dispensed through the holes 213, 221, and 241 with a nozzle of a conventional dispensing machine as is known in the art.

Although the invention has been described in the context of the sensor device 200, those skilled in the art will understand that alternative embodiments are possible. For example, instead of using the conductive die-attach epoxy 234 to connect the inner pads 402 on the interposer 240 to corresponding pads on the P-cell 202, a suitable ball-grid array on either the interposer 240 or the P-cell 202 can be employed.

Although the invention has been described in the context of the sensor device 200 having the G-cell 204 mounted on and wire-bonded to the MCU 206, in alternative embodiments, the G-cell 204 can be mounted on and electrically connected to the MCU 206 in a flip-chip manner without requiring bond wires or the G-cell 204 can be mounted directly on the lead frame flag 212 adjacent to the MCU 206 and electrically connected to the MCU 206 using bond wires. In other alternative embodiments, the G-cell 204 may be omitted. In some embodiments, the acceleration-sensing function of the G-cell 204 may be implemented by the MCU 206, by the P-cell 202, or not at all (for sensor-device applications that do not require acceleration sensing). Note further that some embodiments may have one or more other dies (not shown) mounted, for example, onto the MCU 206 or onto the flag 212 adjacent to the MCU 206.

Although the invention has been described in the context of the pressure-sensing sensor device 200 having a P-cell 202 with a pressure-sensitive active region 203, those skilled in the art will understand that, in alternative embodiments, the invention can be implemented in the context of other types of sensor devices having other types of sensor dies with active regions that are designed to detect features other than pressure, such as, without limitation, temperature, radiation (including visible light), or specific chemical compounds.

As used herein, the term "mounted onto" as in "a die mounted onto a lead frame flag" covers situations in which the die is mounted directly onto the flag with no other intervening dies or other structures except an adhesive layer as well as situations in which the die is directly mounted onto another die, which is itself mounted directly onto the flag. Note that "mounted onto" also covers situations in which there are two or more intervening structures between the die and flag. Depending on the situation, the term "mounted" can imply electrical connection in addition to physical attachment, where the electrical connection may be provided by one or more bond wires, one or more metal bumps, and/or any other suitable technique.

Those skilled in the art will understand that the invention can be implemented in a variety of different types of packages including (without limitation) no-leads type packages such as quad flat no-leads (QFN) packages, ball grid array (BGA) packages, molded array packages (MAP), quad flat pack (QFP) packages, and small-outline (SO) packages.

A lead frame is a collection of metal leads and possibly other elements (e.g., die flags and power bars) that is used in semiconductor packaging for assembling one or more integrated circuit (IC) dies into a single packaged semiconductor device. Prior to assembly into a packaged device, a lead frame may have support structures (e.g., a rectangular metal frame and tie bars) that keep those elements in place. During the assembly process, the support structures may be removed. As used herein, the term "lead frame" may be used to refer to the collection of elements before assembly or after assembly, regardless of the presence or absence of those support structures.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A semiconductor sensor device comprising:
   a lead-frame flag having a vent hole;
   an interposer mounted onto the lead-frame flag and having a vent hole in fluid communication with the vent hole of the lead-frame flag;
   a pressure-sensing die having a pressure-sensitive active region, wherein the pressure-sensing die is mounted onto and electrically connected to the interposer in a flip-chip manner such that the vent hole of the interposer is in fluid communication with the pressure-sensitive active region of the sensor die, wherein the vent hole of the interposer is in fluid communication with the pressure-sensitive active region of the pressure-sensing die to enable the pressure-sensing die to sense ambient atmospheric pressure outside of the device;
   bond wires electrically connecting the interposer to one or more other components of the device; and
   molding compound encapsulating the sensor die, the interposer, and the bond wires.

2. The device of claim 1, further comprising a micro control unit (MCU) die that is mounted onto the lead-frame flag, electrically connected to the interposer via one or more of the bond wires, and encapsulated in the molding compound.

3. The device of claim 2, further comprising an acceleration-sensing die that is electrically connected to the MCU die and encapsulated in the molding compound.

4. The device of claim 1, wherein all bond wires in the device are encapsulated within the molding compound.

5. A semiconductor sensor device comprising:
   a lead-frame flag having a vent hole;
   an interposer mounted onto the lead-frame flag and having a vent hole in fluid communication with the vent hole of the lead-frame flag;
   a sensor die having an active region, wherein the sensor die is mounted onto and electrically connected to the interposer in a flip-chip manner such that the vent hole of the interposer is in fluid communication with the active region of the sensor die, wherein the vent holes of the lead-frame flag and the interposer are co-aligned with each other and with the active region of the sensor die;
   bond wires electrically connecting the interposer to one or more other components of the device; and
   molding compound encapsulating the sensor die, the interposer, and the bond wires.

6. A semiconductor sensor device comprising:
   a lead-frame flag having a vent hole, wherein the lead-frame flag functions as a lid for the device;
   an interposer mounted onto the lead-frame flag and having a vent hole in fluid communication with the vent hole of the lead-frame flag;
   a sensor die having an active region, wherein the sensor die is mounted onto and electrically connected to the interposer in a flip-chip manner such that the vent hole of the interposer is in fluid communication with the active region of the sensor die;
   bond wires electrically connecting the interposer to one or more other components of the device; and
   molding compound encapsulating the sensor die, the interposer, and the bond wires.

7. A semiconductor sensor device comprising:
   a lead-frame flag having a vent hole;
   an interposer mounted onto the lead-frame flag and having a vent hole in fluid communication with the vent hole of the lead-frame flag;
   a sensor die having an active region, wherein the sensor die is mounted onto and electrically connected to the interposer in a flip-chip manner such that the vent hole of the interposer is in fluid communication with the active region of the sensor die, and wherein the active region of the sensor die is not covered by a pressure-sensitive gel;
   bond wires electrically connecting the interposer to one or more other components of the device; and
   molding compound encapsulating the sensor die, the interposer, and the bond wires.

8. A method for manufacturing a semiconductor sensor device, the method comprising:
   mounting an interposer having a vent hole onto a lead-frame flag having a vent hole such that the interposer vent hole is in fluid communication with the flag vent hole;
   mounting onto the interposer in a flip-chip manner, a pressure-sensing die having a pressure-sensitive active region, such that the vent hole of the interposer is in fluid communication with the pressure-sensitive active region of the pressure-sensing die, wherein the vent hole of the interposer is in fluid communication with the pressure-sensitive active region of the pressure-sensing die to enable the pressure-sensing die to sense ambient atmospheric pressure outside of the device;

wire-bonding the interposer to one or more other components of the device using bond wires; and applying molding compound to encapsulate the sensor die, the interposer, and the bond wires.

9. The method of claim 8, further comprising mounting an MCU die onto the lead-frame flag, wherein:

the interposer is wire-bonded to the MCU die; and the MCU die is encapsulated in the molding compound.

10. The method of claim 9, further comprising electrically connecting an acceleration-sensing die onto the MCU die, wherein the acceleration-sensing die is encapsulated in the molding compound.

11. The method of claim 8, wherein all bond wires in the device are encapsulated within the molding compound.

12. A method for manufacturing a semiconductor sensor device, the method comprising:

mounting an interposer having a vent hole onto a lead-frame flag having a vent hole such that the interposer vent hole is in fluid communication with the flag vent hole;

mounting onto the interposer in a flip-chip manner, a sensor die having an active region, such that the vent hole of the interposer is in fluid communication with the active region of the sensor die, wherein the vent holes of the lead-frame flag and the interposer are co-aligned with each other and with the active region of the sensor die;

wire-bonding the interposer to one or more other components of the device using bond wires; and applying molding compound to encapsulate the sensor die, the interposer, and the bond wires.

13. A method for manufacturing a semiconductor sensor device, the method comprising:

mounting an interposer having a vent hole onto a lead-frame flag having a vent hole such that the interposer vent hole is in fluid communication with the flag vent hole, wherein the lead-frame flag functions as a lid for the device;

mounting onto the interposer in a flip-chip manner, a sensor die having an active region, such that the vent hole of the interposer is in fluid communication with the active region of the sensor die;

wire-bonding the interposer to one or more other components of the device using bond wires; and applying molding compound to encapsulate the sensor die, the interposer, and the bond wires.

14. A method for manufacturing a semiconductor sensor device, the method comprising:

mounting an interposer having a vent hole onto a lead-frame flag having a vent hole such that the interposer vent hole is in fluid communication with the flag vent hole;

mounting onto the interposer in a flip-chip manner, a sensor die having an active region, such that the vent hole of the interposer is in fluid communication with the active region of the sensor die and wherein the active region of the sensor die is not covered by a pressure-sensitive gel;

wire-bonding the interposer to one or more other components of the device using bond wires; and applying molding compound to encapsulate the sensor die, the interposer, and the bond wires.

\* \* \* \* \*